United States Patent
Hawley et al.

[11] Patent Number: 5,804,500
[45] Date of Patent: Sep. 8, 1998

[54] FABRICATION PROCESS FOR RAISED TUNGSTEN PLUG ANTIFUSE

[75] Inventors: Frank W. Hawley, Campbell; John L. McCollum, Saratoga; Ying Go, Palo Alto; Abdelshafy Eltoukhy, San Jose, all of Calif.

[73] Assignee: Actel Corporation, Sunnyvale, Calif.

[21] Appl. No.: 657,971

[22] Filed: Jun. 4, 1996

Related U.S. Application Data

[63] Continuation of Ser. No. 460,417, Jun. 2, 1995, abandoned.

[51] Int. Cl.$^6$ .................................................. H01L 21/44
[52] U.S. Cl. ............................................................ 435/600
[58] Field of Search ................................. 437/48, 52, 66, 437/192, 228, 922; 257/50, 530; 438/600, 23

[56] References Cited

U.S. PATENT DOCUMENTS

| | | | |
|---|---|---|---|
| 4,651,409 | 3/1987 | Ellsworth et al. | 29/576 |
| 4,748,490 | 5/1988 | Hollingsworth | 357/51 |
| 4,796,075 | 1/1989 | Whitten | 357/51 |
| 4,822,753 | 4/1989 | Pintchovski et al. | 427/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,181,096 | 1/1993 | Forouhi | 257/530 |

(List continued on next page.)

FOREIGN PATENT DOCUMENTS

| | | | |
|---|---|---|---|
| 0162529 | 3/1989 | European Pat. Off. | H01L 29/32 |
| 0323078 | 7/1989 | European Pat. Off. | H01L 23/52 |
| 0414361 | 2/1991 | European Pat. Off. | H01L 23/52 |

(List continued on next page.)

OTHER PUBLICATIONS

Burns, et al., "Titanium Dioxide Dielectric Films Formed by Rapid Thermal Oxidation", J. Appl. Phys. 65(5), Mar. 1, 1989, pp. 2095–2097.

Cohen, et al., "A Flat–Aluminum Based Voltage–Programmable Link for Field–Programmable Devices", IEEE Transactions on Electron Devices, vol. 41, No. 5, May 1994, pp. 721–724.

Gordon, et al., "Conducting Filament of the Programmed Metal Electrode Amorphous Silicon Antifuse", 1993 IEEE, IEDM, pp. 93–27 to 93–30.

Hu, C., "Interconnect Devices for Field Programmable Gate Array", 1992 IEEE, IEDM, pp. 92–591 to 92–594.

Pauleau, Y., "Interconnect Materials for VLSI Circuits", Solid State Technology, Apr., 1987, pp. 155–162.

*Primary Examiner*—John Niebling
*Assistant Examiner*—Joni Y. Chang
*Attorney, Agent, or Firm*—D'Alessandro & Ritchie

[57] ABSTRACT

An antifuse comprises a lower electrode formed from a metal layer in a microcircuit. A interlayer dielectric layer is disposed over the lower electrode and has an aperture formed therein. A conductive plug, formed from a material such as tungsten, is formed in the aperture. The upper surface of the interlayer dielectric is etched back to create a raised portion of the plug. The upper edges of the plug are rounded. An antifuse layer, preferably comprising a silicon nitride, amorphous silicon, silicon nitride sandwich incorporating a thin silicon dioxide layer above or below the amorphous silicon layer or such a sandwich structure covered by a titanium nitride layer, is disposed above the plug. An upper electrode, preferably comprising a metal layer is disposed over the antifuse layer.

12 Claims, 4 Drawing Sheets

U.S. PATENT DOCUMENTS

| | | | |
|---|---|---|---|
| 5,194,759 | 3/1993 | El-Ayat et al. | 307/202.1 |
| 5,196,724 | 3/1993 | Gordon et al. | 257/530 |
| 5,233,206 | 8/1993 | Lee et al. | 257/50 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,298,433 | 3/1994 | Furuyama | 437/8 |
| 5,300,456 | 4/1994 | Tigelaar et al. | 437/195 |
| 5,302,546 | 4/1994 | Gordon et al. | 437/170 |
| 5,304,508 | 4/1994 | Cohen | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit et al. | 257/530 |
| 5,332,929 | 7/1994 | Chiang | 307/296.3 |
| 5,353,246 | 10/1994 | Tsang et al. | 365/96 |
| 5,381,035 | 1/1995 | Chen et al. | 257/530 |
| 5,387,311 | 2/1995 | Hall et al. | 156/630 |
| 5,390,141 | 2/1995 | Cohen et al. | 365/96 |
| 5,391,513 | 2/1995 | Delgado et al. | 437/60 |
| 5,391,518 | 2/1995 | Bhushan | 437/190 |
| 5,395,797 | 3/1995 | Chen et al. | 437/195 |
| 5,403,778 | 4/1995 | Kwok et al. | 437/188 |
| 5,404,029 | 4/1995 | Husher et al. | 257/50 |
| 5,412,245 | 5/1995 | Favreau | 257/530 |
| 5,412,593 | 5/1995 | Magel et al. | 365/96 |
| 5,482,884 | 1/1996 | McCollum et al. | 437/60 |
| 5,485,031 | 1/1996 | Zhang et al. | 257/530 |
| 5,581,111 | 12/1996 | Chen | 257/530 |

FOREIGN PATENT DOCUMENTS

| | | | |
|---|---|---|---|
| 0416903 | 3/1991 | European Pat. Off. | H01L 21/3205 |
| 0452091 | 10/1991 | European Pat. Off. | H01L 23/525 |
| 0455414 | 11/1991 | European Pat. Off. | H01L 23/525 |
| 0500034 | 8/1992 | European Pat. Off. | H01L 23/525 |
| 0501120 | 9/1992 | European Pat. Off. | H01L 23/525 |
| 0528417 | 2/1993 | European Pat. Off. | G11C 17/16 |
| 0539197 | 4/1993 | European Pat. Off. | H01L 23/525 |
| 2367352 | 10/1977 | France | H01L 27/06 |
| 59-098971 | 12/1985 | Japan | H01L 29/78 |
| 06 302701 | 10/1994 | Japan | H01L 21/82 |
| 2222024 | 2/1990 | United Kingdom | H01L 21/82 |
| 87/00969 | 2/1987 | WIPO | H01L 23/52 |
| 87/02827 | 5/1987 | WIPO | H01L 27/24 |
| 92/13359 | 8/1992 | WIPO | H01L 21/285 |
| 92/20109 | 11/1992 | WIPO | H01L 45/00 |
| 92/21154 | 11/1992 | WIPO | H01L 21/44 |
| 93/03499 | 2/1993 | WIPO | H01L 23/525 |
| 93/04499 | 3/1993 | WIPO | H01L 21/70 |
| 93/05514 | 3/1993 | WIPO | G11C 17/16 |

FABRICATION PROCESS FOR RAISED TUNGSTEN PLUG ANTIFUSE

CROSS-REFERENCE TO RELATED APPLICATION

This application is a continuation of patent application Ser. No. 08/460,417, filed Jun. 2, 1995.

BACKGROUND OF THE INVENTION

1. Field of the Invention

The present invention relates to user-programmable antifuse devices. More particularly, the present invention relates to several embodiments of a raised tungsten plug antifuse and to methods for fabricating such antifuses.

2. The Prior Art

Various antifuse structures are known in the prior art. The prior-art antifuses may be divided into two groups. A first group includes those antifuses in which the lower electrode comprises a conductive region in a semiconductor substrate and the upper electrode comprises a layer above the substrate. A layer of antifuse material disposed between the lower and upper electrodes usually comprises a single dielectric layer or a plurality of dielectric layers. An example of such an antifuse is shown in U.S. Pat. No. 4,823,181 to Mohsen et al. and U.S. Pat. No. 4,543,594 to Mohsen et al.

A second group of antifuses comprises antifuses in which both electrodes are disposed in layers above the surface of a substrate which may be either a conducting material, a semiconductor material, or an insulating material. The electrodes may comprise materials such as metal layers or polysilicon layers. A layer of antifuse material disposed between the lower and upper electrodes may comprise a single dielectric layer, a plurality of dielectric layers, a layer of a material such as amorphous silicon, or a layer of a material such as amorphous silicon in combination with one or more dielectric layers. The second group of antifuses is more closely associated with the present invention.

Examples of above-the-substrate antifuses include those disclosed in U.S. Pat. No. 5,070,384 to McCollum et al., U.S. Pat. No. 5,175,715 to Husher et al., U.S. Pat. No. 5,181,096 to Forouhi, U.S. Pat. No. 5,272,101 to Forouhi et al., and U.S. Pat. No. 5,196,724 to Gordon et al.

It is an object of the present invention to provide an improved above-the-substrate antifuse and methods for fabricating such an antifuse.

BRIEF DESCRIPTION OF THE INVENTION

An antifuse according to the present invention includes a lower electrode formed from a metal layer in a microcircuit. A interlayer dielectric layer is disposed over the lower electrode and has an aperture formed therein. A conductive plug, formed from a material such as tungsten, is formed in the aperture. The upper surface of the interlayer dielectric is etched back to create a raised portion of the plug extending from about 250 to about 1500 angstroms above the upper surface of the interlayer dielectric. The upper edges of the plug are rounded. An antifuse layer, preferably comprising a silicon nitride, amorphous silicon, silicon nitride sandwich or a silicon nitride, amorphous silicon, silicon nitride sandwich covered by a titanium nitride layer, is disposed above the plug. Oxide spacers may be disposed around the edges of the antifuse layer. An upper electrode, preferably comprising a metal layer including a titanium nitride barrier layer is disposed over the antifuse layer.

The antifuse of the present invention may be fabricated according to another aspect of the present invention. A lower electrode is first formed from a metal layer disposed over an underlying insulating layer. A interlayer dielectric layer is formed over the lower electrode and is planarized using techniques such as chemical mechanical polishing (CMP). An aperture is formed in the interlayer dielectric layer.

A conductive plug, comprising a material such as tungsten, is formed in the aperture. The upper surface of the interlayer dielectric is then etched back, exposing a portion of the plug to create a raised portion of the plug. The upper edges of the plug are then rounded using, for example, a CMP process step which also serves to smooth any rough points from the plug surface.

An antifuse layer, preferably comprising a silicon nitride, amorphous silicon, silicon nitride sandwich or a silicon nitride, amorphous silicon, silicon nitride sandwich covered by a titanium nitride layer, is formed and defined over the plug and at least a portion of the upper surface of the interlayer dielectric layer. In a variation of this process sequence, an additional titanium nitride layer is formed over the plug and the upper surface of the interlayer dielectric layer prior to forming the antifuse layer or layers.

Oxide spacers are then formed around the edges of the antifuse layer. An upper electrode, preferably comprising a metal layer, is then formed and defined over the antifuse layer and the oxide spacers.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
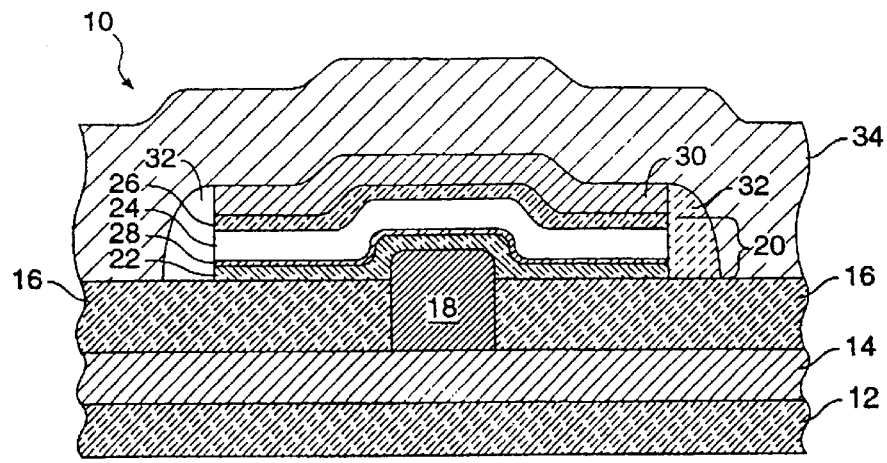
FIG. 1 is a cross-sectional view of an antifuse according to a first embodiment of the present invention.

Referring first to FIG. 1, a cross sectional view of an antifuse 10 according to a first embodiment of the present invention is presented. Antifuse 10 is fabricated over a suitable substrate 12. Substrate 12 may be one of numerous things, including, but not limited to, an insulating layer disposed above a semiconductor substrate containing functional circuits or other structures. The nature of substrate 12 is not important to the present invention but those of ordinary skill in the art will understand that the usual environment of the present invention will be an integrated circuit.

The lower conductive electrode 14 of the antifuse 10 of the present invention may comprise a portion of a metal layer or composite metal layer used as an interconnect layer in the integrated circuit and may thus be fabricated from materials known for such use. Such metal layers typically have thicknesses in the range of from about 5,000 angstroms to about 12,000 angstroms, typically about 9,000 angstroms, although these thicknesses are illustrative only and are not limiting. Persons skilled in the art are familiar with integrated circuit interconnect metal layers and the details of such layers need not be set forth herein.

An interlayer dielectric layer 16 is formed over the surface of the lower conductive electrode 14. Interlayer dielectric layer 16 may be formed from materials such as deposited silicon dioxide. Typical interlayer dielectric layer 16 thicknesses which may be used in the present invention are in the range of from about 5,000 angstroms to about 15,000 angstroms, typically about 9,000 angstroms although this thickness range is illustrative only and not limiting.

A conductive plug 18 is formed in an aperture in the interlayer dielectric layer 16 and extends above its upper surface. According to a presently preferred embodiment of the invention, the raised portion of the conductive plug 18 extends from about 250 to about 1500 angstroms above the upper surface of the interlayer dielectric layer 16 and is formed from a material such as tungsten or titanium nitride. Tungsten plug technology is well understood in the semiconductor arts. As presently preferred, the top edge of the tungsten plug is slightly rounded by a process such as chemical mechanical polishing (CMP) to reduce the otherwise overly high field concentration which would exist at the sharp edge of the upper surface of the conductive plug 18.

The raised tungsten plug 18 allows the antifuse layer breakdown during programming to occur along the rounded corners of the conductive plug 18 due to field concentration in these regions. This provides the advantage of controlling where the conductive link is formed, keeping the link away from the edge of the antifuse layer stack where it could abut an oxide material resulting in an unsymmetrical thermal structure which could materially affect reliability of the programmed device. The rounding of the exposed top of the conductive plug 18 controls the amount of field concentration during programming to prevent uncontrolled breakdown.

According to this first embodiment of the present invention, an antifuse material 20 is disposed above the upper surface of the interlayer dielectric layer 16. As shown in FIG. 1, the antifuse material 20 preferably comprises a sandwich structure including a first layer of silicon nitride 22, a layer of amorphous silicon 24 and a second layer of silicon nitride 26. The thicknesses of the layers 22, 24, and 26 will of course depend on the programming voltage desired. According to a presently preferred embodiment of the present invention, a thin layer 28 of silicon dioxide, e.g. about 1 to 300 angstroms, preferably about 30 angstroms is disposed on the upper surface of either first silicon nitride layer 22 or amorphous silicon layer 24. FIG. 1 shows a thin layer of silicon dioxide 28 disposed on the upper surface of first silicon nitride layer 22 although it is to be understood that silicon dioxide layer 28 could also be disposed on the upper surface of amorphous silicon layer 24. Persons of ordinary skill in the art will recognize that thin silicon dioxide layer 28 may optionally be omitted from antifuse 10.

The purpose of oxide layer 28 is to reduce leakage and raise programming voltage applied in one orientation. If oxide layer 28 is placed on the upper surface of first silicon nitride layer 22, the programming voltage will be higher if the positive potential is applied to the lower conductive electrode 14. If oxide layer 28 is placed on the upper surface of amorphous silicon layer 24, the programming voltage will be higher if the positive potential is applied to the upper electrode.

Antifuse 10 of FIG. 1 includes a layer of titanium nitride 30 having a typical thickness in the range of about 500 to about 3,000, typically about 2,000 angstroms, disposed over the upper surface of second silicon nitride layer 26. The titanium nitride layer 30 serves to create the conductive link and prevent aluminum from being incorporated into the link. As presently preferred, after formation of the titanium nitride layer 30, the layers 22, 24, 26, 28 and 30 are defined in a single etching step and an oxide spacer 32 is formed around the periphery of the defined structure to improve step coverage of the overlying layer.

An upper conductive electrode 34 completes the structure of antifuse 10. As with the lower conductive electrode 14, the upper conductive electrode 34 may comprise a portion of a metal interconnect layer in the integrated circuit containing antifuse 10. Those of ordinary skill in the art will recognize that other layers and structures, such as passivation layers and contacts, will be formed in the integrated circuit containing antifuse 10. These layers and structures are well known and are not shown in the drawing figures to avoid overcomplicating the disclosure and thus obscuring the disclosure of the invention herein.

The programming of antifuse 10 of FIG. 1 will be understood by those of ordinary skill in the art from the following example. An exemplary antifuse may be fabricated according to the present invention, wherein first and second layers of silicon nitride 22 and 26 are about 65 angstroms thick, amorphous silicon layer 24 is about 450 angstroms thick, and oxide layer 28 is about 30 angstroms thick and is disposed over the first silicon nitride layer 22. In such a case, the antifuse 10 should program at a voltage of about 10.5 volts if the positive potential is applied to the upper conductive electrode 34. On the other hand, the antifuse 10 should program at a voltage of about 12 volts if the positive potential is applied to the lower conductive electrode 14.

Figure 2A:
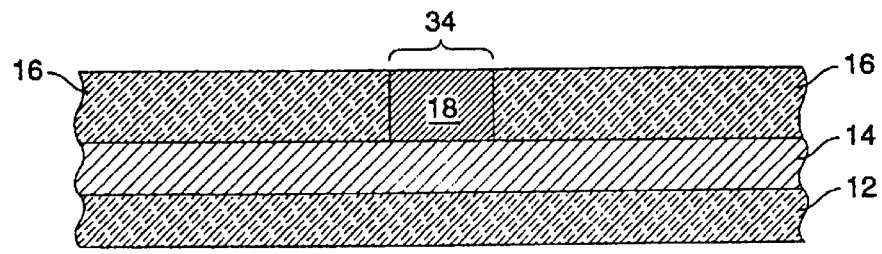
FIGS. 2a–2e are cross sectional views of the antifuses of FIG. 1 shown after completion of selected steps in its fabrication.

Referring now to FIGS. 2a–2e, cross-sectional views of the antifuse 10 of FIG. 1 are shown after completion of selected steps in the fabrication process. Referring first to FIG. 2a, lower conductive electrode 14 has been formed on substrate 12 by use of conventional materials processing technology. Portions of the layer of which lower conductive electrode 14 is a part (not shown) have been defined using standard photolithographic and etching techniques. Interlayer dielectric layer 16, preferably comprising a layer of silicon dioxide has been formed over the upper surface of lower conductive electrode 14, preferably using low-temperature deposition techniques and an antifuse aperture 36 has been formed therein. A tungsten plug 18 has been formed in antifuse aperture 36 using blanket CVD deposition techniques and has been etched back to expose the upper surface of interlayer dielectric layer 16 as is well known in the art. FIG. 2a shows the structure resulting after completion of these process steps.

Figure 2B:
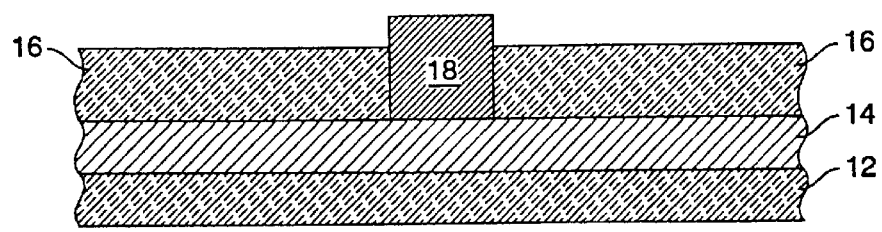

Referring now to FIG. 2b, the tungsten plug 18 has been raised above the surface of the interlayer dielectric layer 16 by etching back the surface of the interlayer dielectric layer 16 using techniques such as wet chemical or dry chemical etching. According to a presently preferred embodiment of the invention, after completion of the etching step, the tungsten plug 18 extends beyond the upper surface of the interlayer dielectric layer 16 by from about 250 to about 1500 angstroms, preferably about 500 angstroms above the upper surface of the interlayer dielectric layer 16. FIG. 2b shows the structure resulting after completion of the raised plug etching step.

Figure 2C:
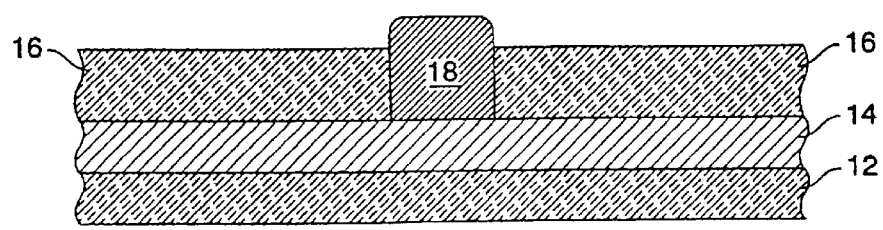

Next, as shown in FIG. 2c, a chemical mechanical polishing (CMP) step is performed to slightly round the corners of the top of the tungsten plug 18. This step may be performed using chemical mechanical polishing equipment for about 0.5 minutes with mechanical silicon oxide abrasive such as is used in typical planarization steps. FIG. 2c shows the structure resulting after completion of the CMP step. The CMP step removes the sharp corners of the tungsten plug 18 and assures that unnecessarily high fields will not exist during application of programming voltages and result in uncertain programming voltage distributions in production.

Figure 2D:
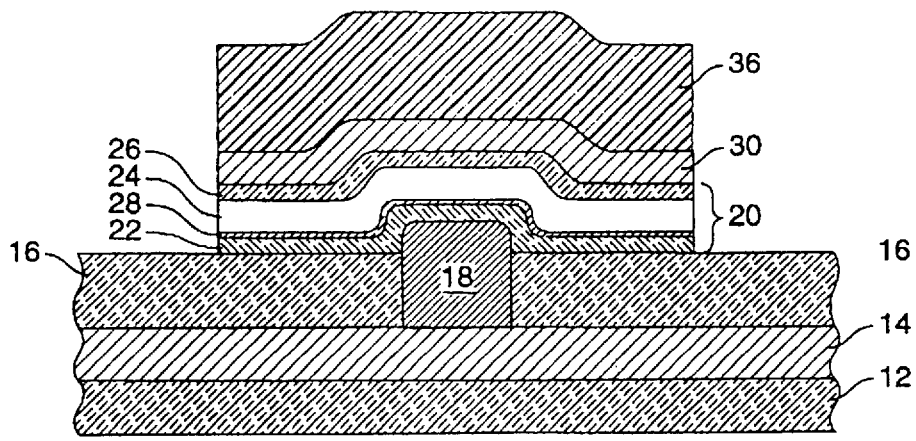

Referring now to FIG. 2d, antifuse layer 20 is formed. According to a presently preferred embodiment of the invention, a first layer of silicon nitride 22 is formed to a thickness of between about 1 angstrom and about 300 angstroms, typically about 65 angstroms, using CVD techniques. Next, a thin layer of silicon dioxide 28, having a thickness of between about 1 to 300 angstroms, preferably about 30 angstroms, is formed over the upper surface of silicon nitride layer 22, preferably using CVD techniques if the preferred embodiment of the invention is to be practiced. Next, a layer of amorphous silicon 24 is formed over the silicon dioxide layer 28 to a thickness of between about 100 angstroms and about 1,500 angstroms, typically about 450 angstroms, using CVD techniques. The amorphous silicon layer 24 may be undoped or may be doped to a level of less than about 1e18 using phosphorous, arsenic, nitrogen, or oxygen. A second silicon nitride layer 26 having as thickness of between about 1 angstrom and about 300 angstroms, typically about 65 angstroms, is next formed over the surface of the amorphous silicon layer 24 using CVD techniques. Despite the showing in FIG. 2d of the positioning of the thin oxide layer 28 over first silicon nitride layer 22, those of ordinary skill in the art will appreciate that the thin oxide layer 28 is formed either before the amorphous silicon layer 24 or before the second silicon nitride layer 26.

A layer of titanium nitride 30 having a thickness of between about 500 angstroms and about 3,000 angstroms, typically about 2,000 angstroms, is next formed over the second layer of silicon nitride 26 using PVD sputtering or CVD techniques. A conventional photomasking layer 38 is applied over titanium nitride layer 30 and the stack comprising the first silicon nitride layer 22, thin oxide layer 28, the amorphous silicon layer 24, the second silicon nitride layer 26, and the titanium nitride layer 30 and is defined using conventional etching technology. FIG. 2d shows the structure resulting after completion of the stacked structure comprising layers 22, 24, 26, 28 and 30 and the stack definition etching step, but prior to removal of photomask layer 38.

Figure 2E:
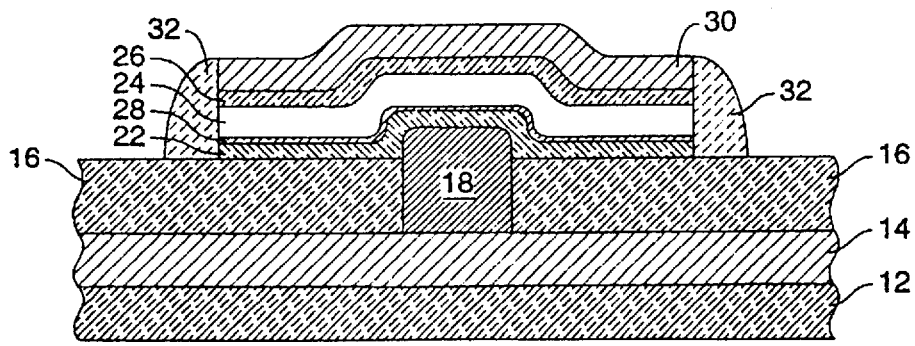

Referring now to FIG. 2e, the masking layer 38 is then removed and an oxide spacer 32 is formed around the edge of the stacked structure. The oxide spacer 32 may be formed by a blanket deposition of silicon dioxide (i.e., about 3,000 angstroms) followed by an plasma etching step as is known in the art. FIG. 2e shows the structure resulting after completion of the spacer etching step.

Next, with reference again to FIG. 1, the upper conductive electrode 34 is formed over the stacked structure, the oxide spacers 32, and the interlayer dielectric layer 16. As will be appreciated by those of ordinary skill in the art, upper conductive electrode 34 may be formed from a portion of an interconnect metal layer in an integrated circuit (including titanium nitride as a barrier layer if aluminum is used as the metal layer) and fabrication of this layer is well known to such skilled persons. Additional conventional back-end steps (not shown) are then used to passivate and otherwise complete the integrated circuit structure.

Figure 3:
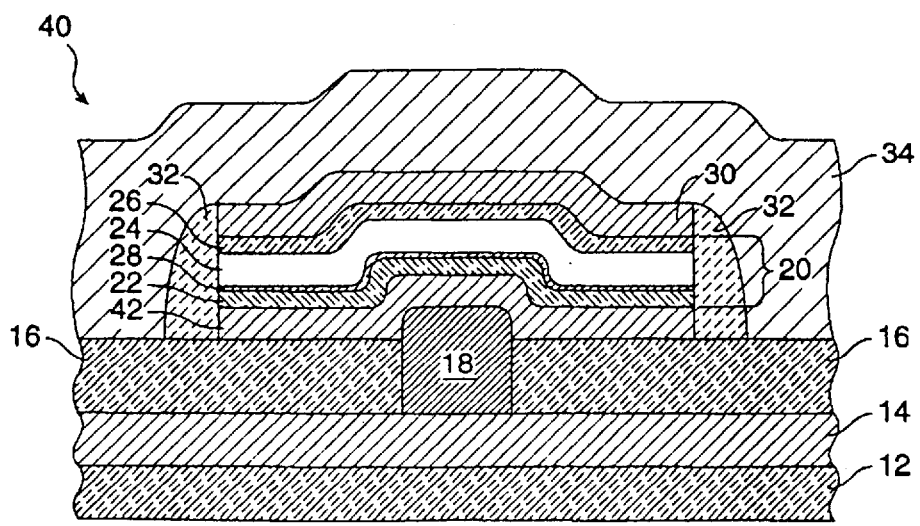
FIG. 3 is a cross-sectional view of an antifuse according to a second embodiment of the present invention.

Referring now to FIG. 3, an antifuse 40 according to a second embodiment of the present invention is shown in cross-sectional view. Because the antifuse 40 of FIG. 3 is similar to the antifuse 10 depicted in FIG. 1, structures in the antifuse 40 of FIG. 3 corresponding to structures in the antifuse 10 of FIG. 1 will be designated by the same reference numerals as used in FIG. 1. As would be expected by persons of ordinary skill in the art, the materials and layer thicknesses for the antifuse 40 of FIG. 3 may be the same as or similar to those of the corresponding structures of the antifuse 10 of FIG. 1.

Antifuse 40 is fabricated over a suitable substrate 12. The lower conductive electrode 14 of the antifuse 40 of the present invention may comprise a portion of a metal layer or composite metal layer used as an interconnect layer in the integrated circuit.

An interlayer dielectric layer 16 is formed over the surface of the lower conductive electrode 14. A conductive plug 18 is formed in an aperture in the interlayer dielectric layer 16 and extends above its upper surface. As presently preferred, the top edge of the tungsten plug 18 is slightly rounded by a process such as chemical mechanical polishing (CMP) to reduce the otherwise overly high field concentration which would exist at the sharp edge of the upper surface of the conductive plug 18.

According to this second embodiment of the present invention, a first titanium nitride layer 42 having a typical thickness in the range of about 500 angstroms to about 3,000 angstroms, typically about 2,000 angstroms, is disposed over the upper surface of interlayer dielectric layer 16 prior to formation of the composite antifuse material layer 20.

An antifuse material 20 is disposed above the upper surface of the first titanium nitride layer 42. As shown in FIG. 3, the antifuse material 20 of the antifuse 40 also preferably comprises a sandwich structure including a first layer of silicon nitride 22, a layer of amorphous silicon 24 and a second layer of silicon nitride 26. As in the embodiment illustrated in FIG. 1, the antifuse material 20 of antifuse 40 preferably, but not necessarily, includes a thin silicon dioxide layer 28, having a thickness of between about 1 to 300 angstroms, preferably about 30 angstroms, located either between the first silicon nitride layer 22 and the amorphous silicon layer 24, or between the amorphous silicon layer 24 and the second silicon nitride layer 26.

The thicknesses of the layers 22, 24, 26, and 28 will of course depend on the programming voltage desired. As an example, if first and second layers silicon nitride 22 and 26 are made about 65 angstroms thick, amorphous silicon layer 24 is made about 450 angstroms thick, and thin oxide layer 28 is made about 30 angstroms thick, the antifuse 40 should program at a voltage of about 10.5 volts as previously disclosed.

A second titanium nitride layer 30 having a typical thickness in the range of about 500 angstroms to about 3,000 angstroms, typically about 2,000 angstroms, is disposed over the upper surface of second silicon nitride layer 26. The second titanium nitride layer 30 serves to provide material from which the conductive link is formed and to prevent aluminum from being incorporated into the link. As presently preferred, after formation of the second titanium nitride layer 30, the layers 42, 22, 24, 26, 28, and 30 are defined in a single etching step and an oxide spacer 32 is formed around the periphery of the defined structure to improve step coverage of the overlying layer and to prevent the upper electrode from shorting to the lower electrode.

An upper conductive electrode 34 completes the structure of antifuse 40. As with the lower conductive electrode 14, the upper conductive electrode 34 may comprise a portion of a metal interconnect layer in the integrated circuit containing antifuse 40. Those of ordinary skill in the art will recognize that other layers and structures, such as passivation layers and contacts, will be formed in the integrated circuit containing antifuse 40. These layers and structures are well known and are not shown in the drawing figures to avoid overcomplicating the disclosure and thus obscuring the disclosure of the invention herein.

Figure 4A:
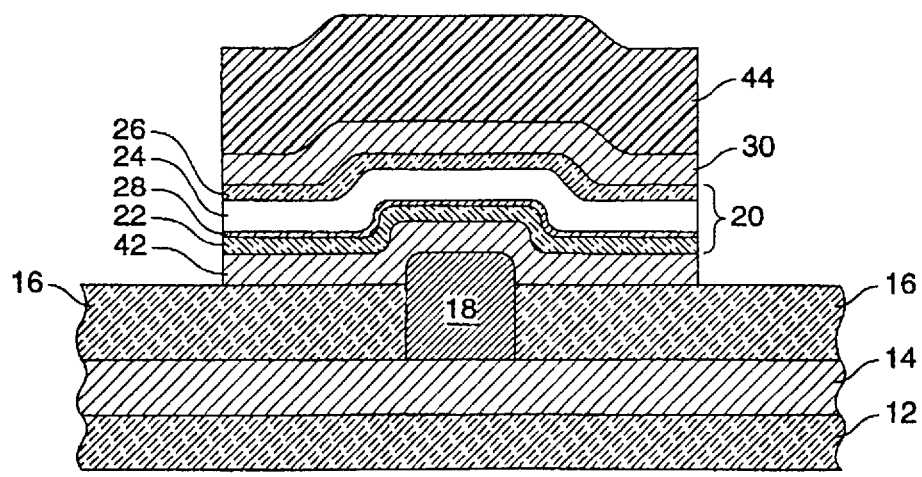
FIGS. 4a–4b are cross sectional views of the antifuse of FIG. 3 shown after completion of selected steps in its fabrication.
Figure 4B:
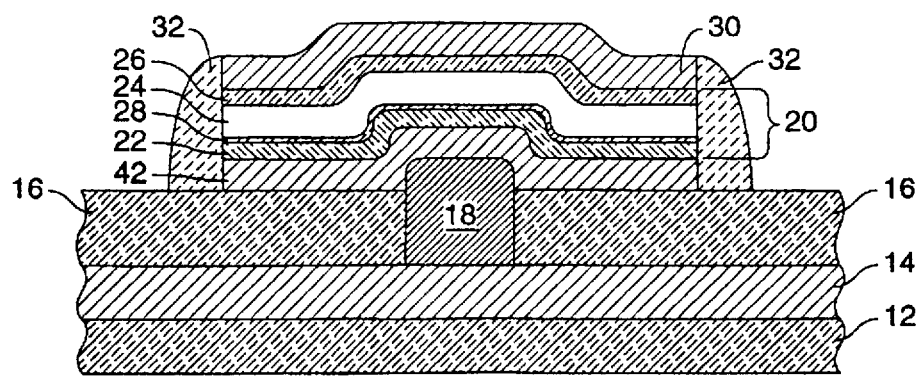

Referring again now to FIGS. 2a–2c and in addition to FIGS. 4a–4b, cross-sectional views of the antifuse of FIG. 3 are shown after completion of selected steps in the fabrication process. FIGS. 2a–2c depict the formation of lower conductive electrode 14, interlayer dielectric layer 16, antifuse aperture 36, and tungsten plug 18, as well as the process steps for raising the tungsten plug 18 above the upper surface of the interlayer dielectric layer 16 and for rounding its corners. FIG. 2a shows the structure resulting after formation of the tungsten plug 18 and planarization of the interlayer dielectric layer 16 and tungsten plug 18. FIG. 2b shows the structure resulting after completion of the raised plug etching step, and FIG. 2c shows the structure resulting after completion of the CMP step.

Referring now to FIG. 4a, first titanium nitride layer 42 is formed over the tungsten plug 18 and the upper surface of interlayer dielectric layer 16 to a thickness of between about 500 angstroms and about 3,000 angstroms, typically about 2,000 angstroms, using PVD or CVD techniques. Antifuse material layer 20 is then formed.

As in the embodiment of FIG. 1, it is preferred to use a multilayer structure for antifuse material layer 20. A first layer of silicon nitride 22 is formed to a thickness of between about 1 angstrom and about 300 angstroms, typically about 65 angstroms, using CVD techniques. Next, a layer of amorphous silicon 24 is formed over the silicon nitride layer 22 to a thickness of between about 100 angstroms and about 1,500 angstroms, typically about 450 angstroms, using CVD techniques. The amorphous silicon layer 24 may be undoped or may be doped to a level of less than about 1e18 using phosphorous, arsenic, nitrogen, or oxygen. A second silicon nitride layer 26 having as thickness of between about 1 angstrom and about 300 angstroms, typically about 65 angstroms, is next formed over the surface of the amorphous silicon layer 24 using CVD techniques. According to a presently preferred embodiment of the invention, a thin silicon dioxide layer 28, having a thickness of between about 1 to 300 angstroms, preferably about 30 angstroms, is formed either immediately after formation of the first silicon nitride layer 22, or immediately after formation of the amorphous silicon layer 24, using CVD techniques.

A second layer of titanium nitride 30 having a thickness of between about 500 angstroms and about 3,000 angstroms, typically about 2,000 angstroms, is next formed over the second layer of silicon nitride 26 using PVD or CVD techniques. A conventional photomasking layer 44 is applied over second titanium nitride layer 30 and the stack comprising the first titanium nitride layer 42, the first silicon nitride layer 22, the oxide layer 28, the amorphous silicon layer 24, the second silicon nitride layer 26, and the second titanium nitride layer 30 is defined using conventional etching technology. FIG. 4a shows the structure resulting after completion of the stacked structure comprising layers 42, 22, 24, 26, 28 and 30 and the stack definition etching step, but prior to removal of photomasking layer 44.

Referring now to FIG. 4b, the masking layer 44 is then removed and an oxide spacer 32 is formed around the edge of the stacked structure. The oxide spacer 32 may be formed by a blanket deposition of silicon dioxide (i.e., about 3,000 angstroms) followed by an plasma etching step as is known in the art. FIG. 4b shows the structure resulting after completion of the spacer etching step.

Next, with reference again to FIG. 3, the upper conductive electrode 34 is formed over the stacked structure, the oxide spacers 32, and the interlayer dielectric layer 16. As will be appreciated by those of ordinary skill in the art, upper conductive electrode 34 may be formed from a portion of an interconnect metal layer in an integrated circuit and fabrication of this layer is well known to such skilled persons. Additional conventional back-end steps (not shown) are then used to passivate and otherwise complete the integrated circuit structure.

The major difference between the antifuse 10 in FIG. 1 and the antifuse 40 of FIG. 3 is the presence of the titanium nitride layer 42 between the tungsten plug 18 and the first silicon nitride layer 22 of the antifuse material 20. Because of the presence of this layer in the antifuse 40 of FIG. 3, the unprogrammed antifuse will have a higher capacitance than the unprogrammed antifuse 10 of FIG. 1 whose lower plate comprises only the tungsten plug 18. However, the presence of this additional layer in antifuse 40 of FIG. 3 permits more flexibility in programming voltage polarity. Depending on the polarity of the programming voltage, the link material for the programmed antifuse will come from either titanium nitride layer 30 (positive polarity on the lower electrode 14) or titanium nitride layer 42 (positive polarity on upper electrode 34).

Figure 5:
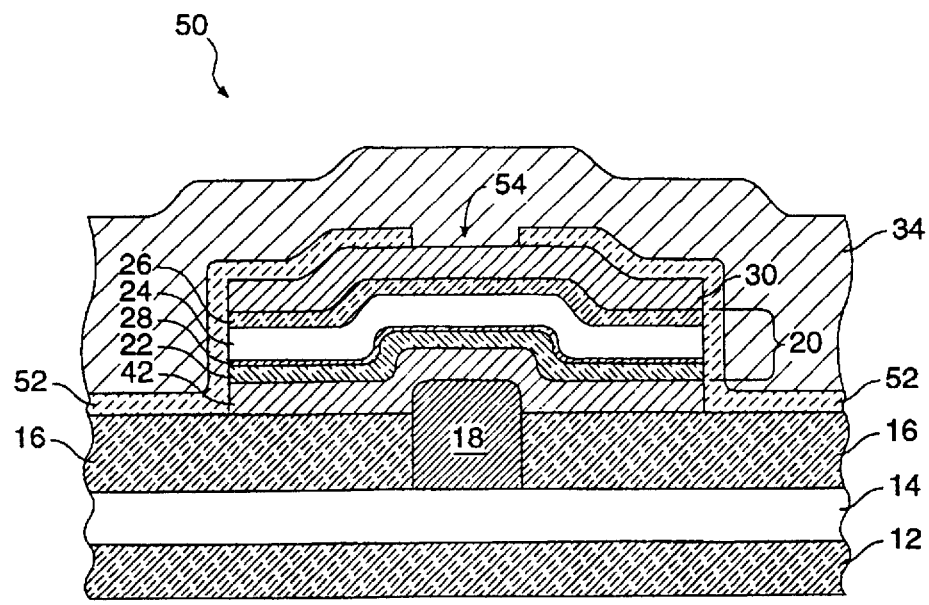
FIG. 5 is a cross-sectional view of an antifuse according to a third embodiment of the present invention.

Referring now to FIG. 5, an antifuse 50 according to a third embodiment of the present invention is shown in cross-sectional view. Antifuse 50 of FIG. 5 is similar to the antifuse 40 depicted in FIG. 3, and therefore structures in the antifuse 50 of FIG. 5 corresponding to structures in the antifuse 40 of FIG. 3 will be designated by the same reference numerals as used in FIG. 3. As would be expected by persons of ordinary skill in the art, the materials and layer thicknesses for the antifuse 50 of FIG. 5 may be the same as or similar to those of the corresponding structures of the antifuse 10 of FIG. 1 and the antifuse 40 of FIG. 3.

Antifuse 50 is fabricated over a suitable substrate 12. Like antifuses 10 and 40 of FIGS. 1 and 3 respectively, the lower conductive electrode 14 of the antifuse 50 of the present invention may comprise a portion of a metal layer or composite metal layer used as an interconnect layer in the integrated circuit.

As in the previous embodiments of antifuse according to the present invention, an interlayer dielectric layer 16 is formed over the surface of the lower conductive electrode 14 and a conductive plug 18 is formed in an aperture in the interlayer dielectric layer 16 and extends above its upper surface. As presently preferred, the top edge of the tungsten plug is slightly rounded by a process such as chemical mechanical polishing (CMP) to reduce the otherwise overly high field concentration which would exist at the sharp edge of the upper surface of the tungsten plug 18.

As in antifuse 40 of the second embodiment of the present invention, antifuse 50 includes a first titanium nitride layer 42 having a typical thickness in the range of about 500 angstroms to about 3,000 angstroms, typically about 2,000 angstroms, and is disposed over the upper surface of interlayer dielectric layer 16 prior to formation of the composite antifuse material layer 20.

An antifuse material 20 is disposed above the upper surface of the first titanium nitride layer 42. As with antifuse 40 of FIG. 3, the antifuse material 20 of the antifuse 50 also preferably comprises a sandwich structure including a first layer of silicon nitride 22, a layer of amorphous silicon 24 and a second layer of silicon nitride 26. As in the embodiment illustrated in FIG. 1, the antifuse material 20 of antifuse 50 preferably, but not necessarily, includes a thin silicon dioxide layer 28, having a thickness of between about 1 to 300 angstroms, preferably about 30 angstroms, located either between the first silicon nitride layer 22 and the amorphous silicon layer 24, or between the amorphous silicon layer 24 and the second silicon nitride layer 26.

The thicknesses of the layers 22, 24, 26, and 28 will of course depend on the programming voltage desired. As an example, if first and second layers silicon nitride 22 and 26 are made about 65 angstroms thick, amorphous silicon layer 24 is made about 450 angstroms thick, and thin oxide layer 28 is made about 30 angstroms thick, the antifuse 50 should program at a voltage of about 10.5 volts as previously disclosed.

A second titanium nitride layer 30 having a typical thickness in the range of about 500 angstroms to about 3,000 angstroms, typically about 2,000 angstroms, is disposed over the upper surface of second silicon nitride layer 26. The second titanium nitride layer 30 serves to provide material from which the conductive link is formed and to prevent aluminum from being incorporated into the link. As presently preferred, after formation of the second titanium nitride layer 30, the layers 42, 22, 24, 26, 28, and 30 are defined in a single etching step.

The major difference between antifuse 50 of FIG. 5 and antifuse 40 of FIG. 3 is the absence of the oxide spacer 32 which was formed around the periphery of the defined structure in antifuse 40 of FIG. 3 to improve step coverage of the overlying layer and to prevent the upper electrode from shorting to the lower electrode. As shown in FIG. 5, antifuse 50 employs a dielectric layer 52, preferably formed from a material such as silicon dioxide, disposed over the stacked structure of layers 42, 22, 24, 26, 28, and 30. An aperture 54 in dielectric layer 52 allows upper electrode 34 to make contact with second titanium nitride layer 30. As will be appreciated by those of ordinary skill in the art, an additional masking and etching sequence are required to form aperture 54 in dielectric layer 52 of antifuse 50 of FIG. 5.

The upper conductive electrode 34 completes the structure of antifuse 50, making contact with second titanium nitride layer 30 through the aperture 54 in dielectric layer 52. As with the lower conductive electrode 14, the upper conductive electrode 34 may comprise a portion of a metal interconnect layer in the integrated circuit containing antifuse 50. Those of ordinary skill in the art will recognize that other layers and structures, such as passivation layers and contacts, will be formed in the integrated circuit containing antifuse 50. These layers and structures are well known and are not shown in the drawing figures to avoid overcomplicating the disclosure and thus obscuring the disclosure of the invention herein.

The fabrication of antifuse 50 of FIG. 5 may be understood with reference first to FIGS. 2A–2c, FIG. 4a, and FIG. 6, cross-sectional views of the antifuse of FIG. 5 shown after completion of selected steps in the fabrication process.

FIGS. 2a–2c depict the formation of lower conductive electrode 14, interlayer dielectric layer 16, antifuse aperture 36, and tungsten plug 18, as well as the process steps for raising the tungsten plug 18 above the upper surface of the interlayer dielectric layer 16 and for rounding its corners. FIG. 2a shows the structure resulting after formation of the tungsten plug 18 and planarization of the interlayer dielectric layer 16 and tungsten plug 18. FIG. 2b shows the structure resulting after completion of the raised plug etching step, and FIG. 2c shows the structure resulting after completion of the CMP step.

Referring now to FIG. 4a, first titanium nitride layer 42 is formed over the tungsten plug 18 and the upper surface of interlayer dielectric layer 16 to a thickness of between about 500 angstroms and about 3,000 angstroms, typically about 2,000 angstroms, using PVD or CVD techniques. Antifuse material layer 20 is then formed.

As in the embodiment of FIGS. 1 and 3, it is preferred to use a multilayer structure for antifuse material layer 20. A first layer of silicon nitride 22 is formed to a thickness of between about 1 angstrom and about 300 angstroms, typically about 65 angstroms, using CVD techniques. Depending on the embodiment desired, a thin silicon dioxide layer 28 is next formed over the upper surface of the first silicon nitride layer 22. FIG. 4a illustrates this step. Next, a layer of amorphous silicon 24 is formed over the silicon nitride layer 22 or the thin oxide layer 28 to a thickness of between about 100 angstroms and about 1,500 angstroms, typically about 450 angstroms, using CVD techniques. The amorphous silicon layer 24 may be undoped or may be doped to a level of less than about 1e18 using phosphorous, arsenic, nitrogen, or oxygen. A second silicon nitride layer 26 having as thickness of between about 1 angstrom and about 300 angstroms, typically about 65 angstroms, is next formed over the surface of the amorphous silicon layer 24 using CVD techniques. Those of ordinary skill in the art will appreciate that thin oxide layer 28 may be formed after formation of amorphous silicon layer 24 and prior to formation of second silicon nitride layer 26, rather than after formation of first silicon nitride layer 22, although this option is not illustrated in the figures.

A second layer of titanium nitride 30 having a thickness of between about 500 angstroms and about 3,000 angstroms, typically about 2,000 angstroms, is next formed over the second layer of silicon nitride 26 using PVD or CVD techniques. A conventional photomasking layer 44 is applied over second titanium nitride layer 30 and the stack comprising the first titanium nitride layer 42, the first silicon nitride layer 22, the amorphous silicon layer 24, the second silicon nitride layer 26, and the second titanium nitride layer 30 is defined using conventional etching technology. FIG. 4a shows the structure resulting after completion of the stacked structure comprising layers 42, 22, 24, 26, 28, and 30 and the stack definition etching step, but prior to removal of photomasking layer 44.

Figure 6:
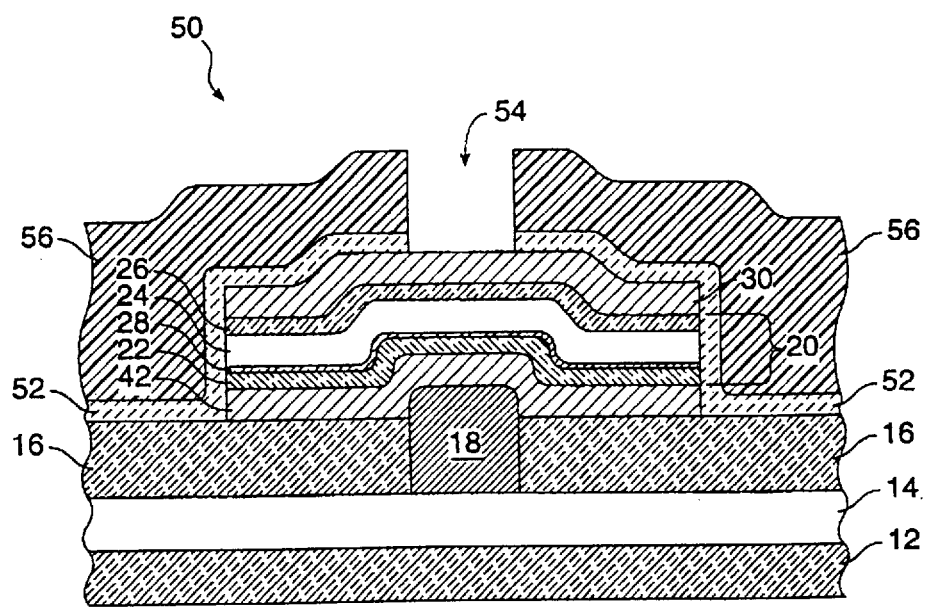
FIG. 6 is a cross sectional view of the antifuse of FIG. 5 shown after completion of selected steps in its fabrication.

Referring now to FIG. 6, the masking layer 44 is then removed and a dielectric layer 52 is formed over the stacked structure and interlayer dielectric layer 16. The dielectric layer 52 may be formed by a blanket deposition of silicon dioxide (i.e., about 500 to about 3,000 angstroms, typically about 1,000) as is known in the art. A photomask 56 is formed over the surface of dielectric layer 52 using conventional photolithography techniques. Aperture 54 is next formed in dielectric layer 52 to expose the upper surface of second titanium nitride layer 30. FIG. 6 shows the structure resulting after completion of the aperture etching step but prior to removal of photomask 56.

Next, with reference again to FIG. 5, the upper conductive electrode 34 is formed over the stacked structure, the dielectric layer 52, and the interlayer dielectric layer 16. As will be appreciated by those of ordinary skill in the art, upper conductive electrode 34 may be formed from a portion of an interconnect metal layer in an integrated circuit and fabrication of this layer is well known to such skilled persons. Additional conventional back-end steps (not shown) are then used to passivate and otherwise complete the integrated circuit structure.

The major difference between the antifuse 40 in FIG. 3 and the antifuse 50 of FIG. 5 is the absence of the oxide spacers 32 and the presence of the dielectric layer 52. As noted, this embodiment requires an additional masking and etching sequence to form the aperture 54 in dielectric layer 52. The advantage of the embodiment of FIG. 5 over the embodiment of FIG. 3 is that, forming, patterning, and etching dielectric layer 52 is more controllable than controlling spacer sidewall height.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming an antifuse on an insulating layer including the steps of:

forming a lower conductive electrode having an upper surface and disposed over the insulating layer;

forming an interlayer dielectric layer over said upper surface of said lower conductive electrode, said interlayer dielectric layer having an upper surface;

forming an aperture within said interlayer dielectric layer communicating with said lower conductive electrode formed therein;

forming a conductive plug in said aperture, said conductive plug having an upper surface raised above said upper surface of said interlayer dielectric layer, an outer edge of said upper surface of said conductive plug being rounded;

forming an antifuse layer having a lower surface and an upper surface, said lower surface disposed over and in contact with all of said upper surface of said conductive plug and at least a portion of said upper surface of said interlayer dielectric layer; and forming an upper electrode over said upper surface of said antifuse layer.

2. The method of claim 1 wherein the step of forming said antifuse layer further includes the steps of forming a first layer comprising silicon nitride, a second layer comprising amorphous silicon, and a third layer comprising silicon nitride.

3. The method of claim 2 wherein outer edges of said first layer, said second layer and said third layer form a substantial vertical wall and further including the step of forming an oxide spacer in contact with said vertical wall.

4. The method of claim 2, further including the step of forming a layer of silicon dioxide between said second layer and one of said first and third layers.

5. A method for forming an antifuse on an insulating layer including the steps of:

forming a lower conductive electrode having an upper surface and disposed over the insulating layer;

forming an interlayer dielectric layer over said upper surface of said lower conductive electrode, said interlayer dielectric layer having an upper surface;

forming an aperture within said interlayer dielectric layer communicating with said lower conductive electrode formed therein;

forming a conductive plug in said aperture, said conductive plug having an upper surface raised above said upper surface of said interlayer dielectric layer, an outer edge of said upper surface of said conductive plug being rounded;

forming an antifuse layer having a lower surface and an upper surface, said lower surface disposed over and in contact with all of said upper surface of said conductive plug and at least a portion of said upper surface of said interlayer dielectric layer;

forming a layer of titanium nitride having an upper surface and a lower surface over said upper surface of said antifuse layer; and forming an upper electrode over said upper surface of said layer of titanium nitride.

6. The method of claim 5 wherein the step of forming said antifuse layer further includes the steps of forming a first layer comprising silicon nitride, a second layer comprising amorphous silicon, and a third layer comprising silicon nitride.

7. The method of claim 6 wherein outer edges of said first layer, said second layer, said third layer, and said titanium nitride layer form a substantial vertical wall and further including the step of forming an oxide spacer in contact with said vertical wall.

8. The method of claim 6, further including the step of forming a layer of silicon dioxide between said second layer and one of said first and third layers.

9. A method for forming an antifuse on an insulating layer including the steps of:

forming a lower conductive electrode having an upper surface and disposed over the insulating layer;

forming an interlayer dielectric layer over said upper surface of said lower conductive electrode, said interlayer dielectric layer having an upper surface;

forming an aperture within said interlayer dielectric layer communicating with said lower conductive electrode formed therein;

forming a conductive plug in said aperture, said conductive plug having an upper surface raised above said upper surface of said interlayer dielectric layer, an outer edge of said upper surface of said conductive plug being rounded;

forming a first layer of titanium nitride having a lower surface and an upper surface, said lower surface disposed over and in contact with all of said upper surface of said conductive plug and at least a portion of said upper surface of said interlayer dielectric layer;

forming an antifuse layer having a lower surface and an upper surface, said lower surface disposed over and in contact with said upper surface of said first layer of titanium nitride;

forming a second layer of titanium nitride having an upper surface and a lower surface disposed over said upper surface of said antifuse layer; and forming an upper electrode disposed over said upper surface of said second layer of titanium nitride.

10. The method of claim 9 wherein the step of forming said antifuse layer further includes the steps of forming a first layer comprising silicon nitride, a second layer comprising amorphous silicon, and a third layer comprising silicon nitride.

11. The method of claim 10 wherein outer edges of said first titanium nitride layer, said first layer, said second layer, said third layer, and said second titanium nitride layer form a substantial vertical wall and further including the step of forming an oxide spacer in contact with said vertical wall.

12. The method of claim 10, further including the step of forming a layer of silicon dioxide between said second layer and one of said first and third layers.

* * * * *